(12) United States Patent
Hopper

(10) Patent No.: US 6,862,720 B1
(45) Date of Patent: Mar. 1, 2005

(54) INTERCONNECT EXHIBITING REDUCED PARASITIC CAPACITANCE VARIATION

(75) Inventor: Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/736,194

(22) Filed: Dec. 15, 2003

Related U.S. Application Data

(62) Division of application No. 10/119,452, filed on Apr. 10, 2002, now Pat. No. 6,723,632, which is a division of application No. 09/429,442, filed on Oct. 28, 1999, now Pat. No. 6,414,367.

(51) Int. Cl.[7] .............................................. G06F 17/50
(52) U.S. Cl. .................................. 716/5; 716/4; 716/6
(58) Field of Search ..................... 716/1, 4–6; 257/503, 257/659–660

(56) References Cited

U.S. PATENT DOCUMENTS

| | | | | |
|---|---|---|---|---|
| 5,128,737 A | | 7/1992 | van der Have | 257/503 |
| 5,136,358 A | * | 8/1992 | Sakai et al. | 357/659 |
| 5,164,334 A | | 11/1992 | Mizushima | 437/203 |
| 5,635,753 A | | 6/1997 | Hofflinger et al. | 257/621 |
| 5,734,187 A | | 3/1998 | Bohr et al. | 257/377 |
| 6,028,986 A | * | 2/2000 | Song | 716/1 |
| 6,084,304 A | | 7/2000 | Huang et al. | 257/762 |
| 6,136,640 A | | 10/2000 | Marty et al. | 438/239 |
| 2001/0002072 A1 | | 5/2001 | Ireland | 257/758 |

FOREIGN PATENT DOCUMENTS

JP  11-352512  12/1999  .......... G02F/1/136

OTHER PUBLICATIONS

Stanley Wolf, "Silicon Processing for the VLSI ERA", vol. 2: Process Integration, 1990, pp. 183–186.

* cited by examiner

Primary Examiner—Vuthe Siek
Assistant Examiner—Naum Levin
(74) Attorney, Agent, or Firm—Stallman & Pollock LLP

(57) ABSTRACT

Adjacent metal lines of an interconnect metallization layer exhibit reduced variation in parasitic capacitance due to the presence of an intervening third metal line. The third metal line is electrically linked to one of the adjacent metal lines and is designed to project into the space between the adjacent metal lines, thereby elevating parasitic capacitance while reducing the range of variation of parasitic capacitance over a known range of critical dimensions. Thickness of the interlayer dielectric formed over the adjacent metal lines can be tailored to trigger penetration of the third metal line within a known range of critical dimensions.

2 Claims, 9 Drawing Sheets

INTERCONNECT EXHIBITING REDUCED PARASITIC CAPACITANCE VARIATION

RELATED APPLICATIONS

This application is a divisional of application Ser. No. 10/119,452, filed Apr. 10, 2002, now U.S. Pat. No. 6,723,632, which is a divisional of application Ser. No. 09/429,442 filed Oct. 28, 1999, now U.S. Pat. No. 6,414,367 issued Jul. 2, 2002.

BACKGROUND OF THE INVENTION

1. Field of the Invention

The present invention relates to a structure and process for reducing variation in interconnect parasitic capacitance, and in particular, to a process and apparatus utilizing insertion of a third metal line between adjacent metal lines to reduce interconnect parasitic capacitance variation.

2. Description of the Related Art

The ever-decreasing feature size of semiconductor devices, and the corresponding increase in packing density, has rendered integrated circuits (IC's) more sensitive than ever to signal propagation delays. At this advanced phase of IC development, IC operation is limited by the delay in propagation of signals between active devices of the circuit, rather than by the speed of the semiconducting devices themselves.

Propagation delay is determined in large part by parasitic resistive-capacitive (RC) delay caused by interconnect linking together various devices of the IC. The magnitude of this RC delay is in turn determined in large measure by the parasitic capacitance ($C_{PAR}$) component.

In designing IC's, engineers can and do take parasitic capacitance into account. However, this task is complicated by the fact that interconnect parasitic capacitance varies between maximum and minimum values. Therefore, the engineer must ensure that the IC can function over the entire range of variation in interconnect parasitic capacitance.

One important source of variation in interconnect parasitic capacitance is the variation in critical dimension (CD) of adjacent metal lines of an interconnect metallization layer. This is illustrated in FIGS. 1A–1C.

FIG. 1A shows a cross-sectional view of an interconnect 100 featuring interconnect metallization layer 102 including adjacent first and second metal lines 102a and 102b respectively. Metal lines 102a and 102b are positioned over lower interlayer dielectric (ILD) 104. First and second metal lines 102a and 102b are formed by patterning a photoresist mask over interconnect metallization layer 102, and then etching interconnect metallization layer 102 in unmasked areas to stop on underlying lower ILD 104. Next, a second interlayer dielectric 106 is formed over the entire surface, such that dielectric material 106 penetrates into inter-line region 108 between metal lines 102a and 102b.

Parasitic capacitance arising between first metal line 100a and second metal line 100b obeys the following equation:

$$C_{PAR} = (\epsilon S)/d, \text{ where}$$

$C_{PAR}$ = parasitic capacitance;
$\epsilon$ = dielectric permittivity;
$S$ = area of the plates of the capacitor; and
$d$ = distance between the adjacent metal lines.

Variation in interconnect parasitic capacitance can be introduced during fabrication of the interconnect structure. One source of parasitic capacitance variation occurs during photolithography leading to formation of the metal lines. Specifically, variation in width of the patterned photoresist mask can in turn induce variation in parasitic capacitance.

This is illustrated by FIGS. 1B and 1C, which also depict cross-sectional views of adjacent metal lines of an interconnect metallization layer.

In FIG. 1B, variation in photolithographic processing has led to formation of adjacent metal lines 102a and 102b possessing a width narrower than that of the adjacent metal lines depicted in FIG. 1A. Because of this changed critical dimension, the distance between adjacent metal lines 102a and 102b is increased. And, as a direct consequence of Equation (I), the corresponding parasitic capacitance is reduced.

Conversely, FIG. 1C shows a cross-sectional view of adjacent metal lines of an interconnect metallization layer wherein photolithographic processing has created metal lines 102a and 102b wider than the adjacent metal lines of FIG. 1A. As a result of this changed critical dimension, the distance between adjacent metal lines 102a and 102b is decreased, and the corresponding parasitic capacitance is increased.

The relation between variation in critical dimension and interconnect parasitic capacitance is shown in FIG. 2. FIG. 2 plots variation in critical dimension ($\Delta CD$) versus parasitic capacitance ($C_{PAR}$). FIG. 2 shows that $\Delta CD$ introduces a spectrum of possible parasitic capacitances into an interconnect structure. This capacitance variation $C_{VAR}$ ranges between a minimum capacitance ($C_{MIN}$) wherein $\Delta CD$ is a negative value (and adjacent metal lines are narrow), and a maximum capacitance ($C_{MAX}$) wherein $\Delta CD$ is a positive value (and adjacent metal lines are wide).

Because variation in parasitic interconnect capacitance governs anticipated signal propagation delay and thereby confines design of IC's, there is a need in the art for an interconnect structure and a process for forming an interconnect structure wherein variation in parasitic interconnect capacitance is minimized.

SUMMARY OF THE INVENTION

The present invention relates to an interconnect structure and a process for forming an interconnect structure, in which variation in parasitic capacitance is reduced. This variation reduction is accomplished by interposing a third metal line between adjacent metal lines of an interconnect metallization layer. The third metal line is in electrical communication with one of the adjacent metal lines. By projecting the third metal line between the adjacent metal lines, variation in parasitic capacitance is reduced over a range of critical dimensions.

An embodiment of a process for forming an interconnect structure in accordance with the present invention comprises the steps of forming a lower interlayer dielectric over a semiconductor workpiece and forming an interconnect metallization layer over the lower interlayer dielectric. A photoresist mask is patterned over the interconnect metallization layer, the photoresist including a masked region having a critical dimension and excluding an unmasked region. The interconnect metallization layer is etched in the unmasked region to leave a first metal line separated from a second metal line by an inter-line region, a width of the first and second metal lines corresponding to the critical dimension, the first and second metal lines exhibiting a parasitic capacitance. A conformal middle interlayer dielectric is formed over the first and second metal lines and over the lower interlayer dielectric in the inter-line region. A third metal line is formed over the conformal middle interlayer dielectric, the third metal line electronically linked with the first metal line and projecting between the first and second metal lines in the inter-line region to elevate the parasitic capacitance and thereby reduce an overall variation in parasitic capacitance over a range of critical dimensions.

An embodiment of an interconnect structure in accordance the present invention comprises a lower interlayer dielectric positioned over a semiconductor workpiece, a first metal line formed over the lower interlayer dielectric, and a second metal line formed over the lower interlayer dielectric and separated from the first metal line by an inter-line region. A middle interlayer dielectric covers the first and second metal lines and the lower interlayer dielectric in the inter-line region. A third metal line projects between the first and second metal lines and is separated from the first and second metal lines by the middle interlayer dielectric, the third metal line in electrical communication with one of the first and the second metal lines.

The features and advantages of the present invention will be understood upon consideration of the following detailed description of the invention and the accompanying drawings.

DETAILED DESCRIPTION

The present invention relates to an interconnect structure and a process for forming an interconnect structure, wherein a third metal line is designed to penetrate between adjacent metal lines of an interconnect metallization layer. The projecting third metal line is electrically coupled with one of the adjacent metal lines, and its presence between the adjacent metal lines reduces variation in parasitic capacitance over a range of critical dimensions.

Figure 1A:
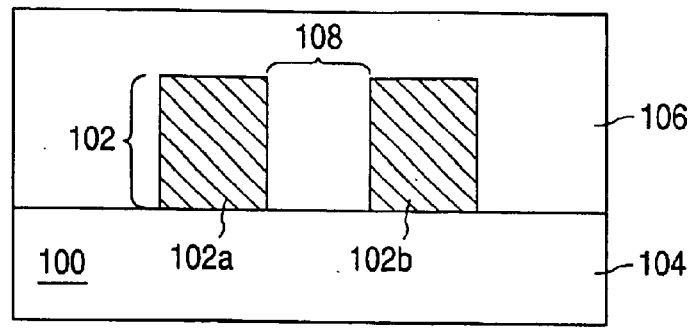
FIGS. 1A–1C show cross-sectional views of various conventional interconnect structures featuring adjacent metal lines of different critical dimensions.
Figure 1B:
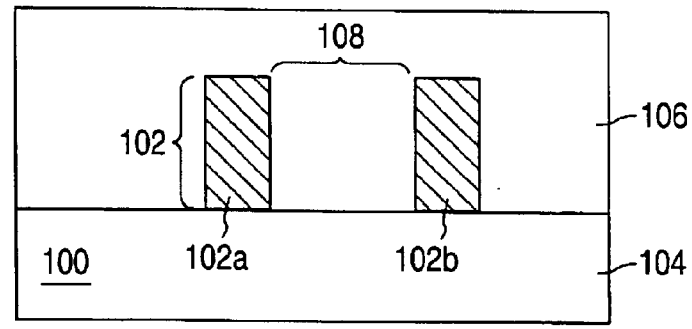
Figure 1C:
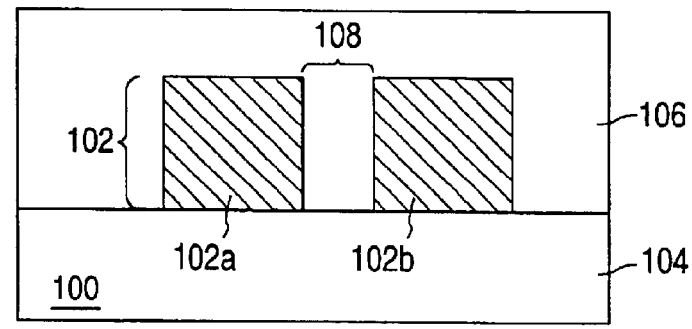
Figure 2:
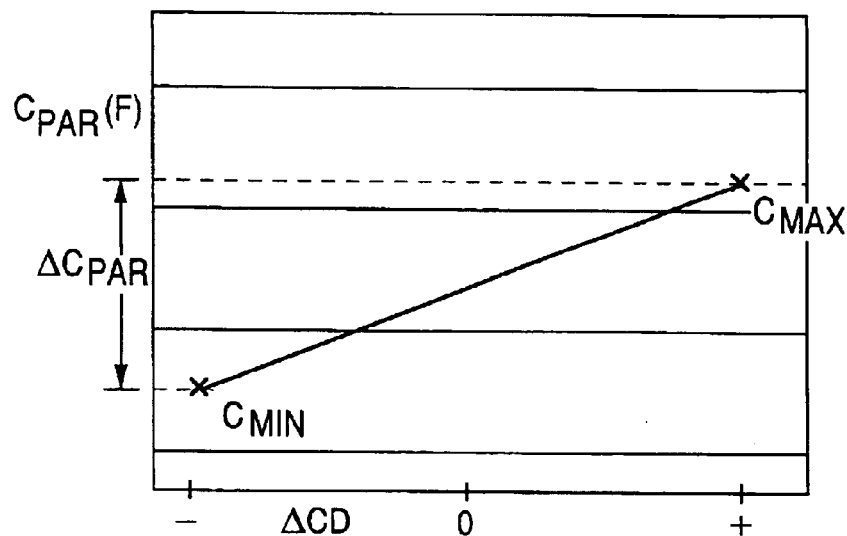
FIG. 2 plots variation in critical dimension versus parasitic capacitance for a conventional interconnect structure.
Figure 3A:
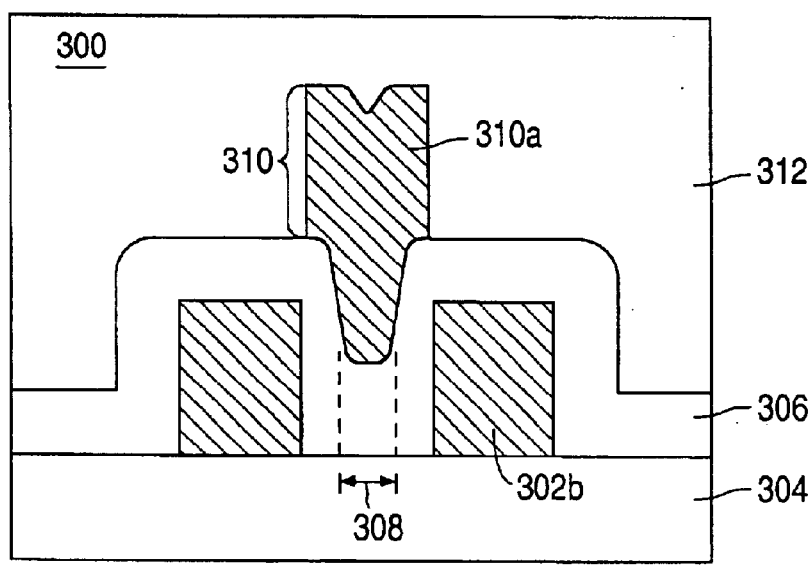
FIGS. 3A–3C show cross-sectional views of interconnect structures in accordance with various embodiments of the present invention featuring adjacent metal lines of different critical dimensions.
Figure 3B:
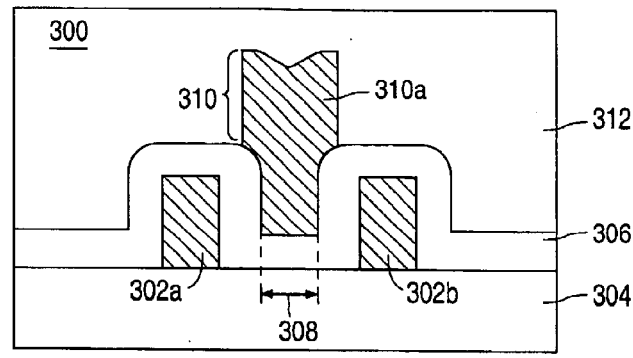
Figure 3C:
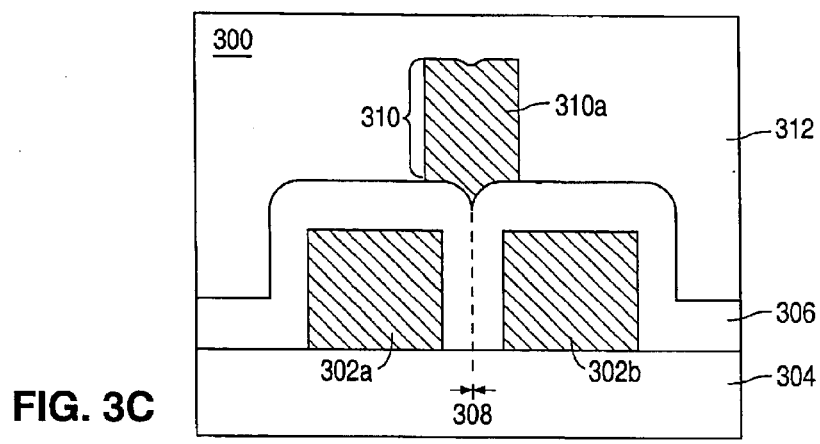

FIGS. 3A–3C show cross-sectional views of adjacent metal lines of three different embodiments of an interconnect structure in accordance with the present invention. Each interconnect 300 includes adjacent first metal line 302a and second metal line 302b formed over first interlayer dielectric 304. Second interlayer dielectric 306 is formed over first and second metal lines 302a and 302b, as well as over first interlayer dielectric 304 in inter-line region 308. A second interconnect metallization layer 310 is formed over second interlayer dielectric 306 and includes third metal line 306a. Upper ILD layer 312 overlies second interconnect metallization 310.

Where inter-line region 308 is sufficiently large, third metal line 306a penetrates into inter-line region 308 between first metal line 302a and second metal line 302b. Third metal line 306a is connected through a via (not shown) with first metal line 302a.

As shown in FIGS. 3A–3C, one factor determining the extent of projection of third metal line 310a between adjacent metal lines 302a and 302b is the critical dimension of metal lines 302a and 302b. Adjacent metal lines 302a and 302b of FIG. 3A possess a moderate critical dimension. FIG. 3B shows that as the critical dimension of lines 302a and 302b shrinks, inter-line region 308 between adjacent metal lines 302a and 302b increases, allowing third metal line 310a to penetrate into inter-line region 308. Conversely, FIG. 3C shows that as the critical dimension of metal lines 302a and 302b increases, the width of the adjacent metal lines increases, reducing inter-line spacing and excluding third metal line 310a.

Figure 3D:
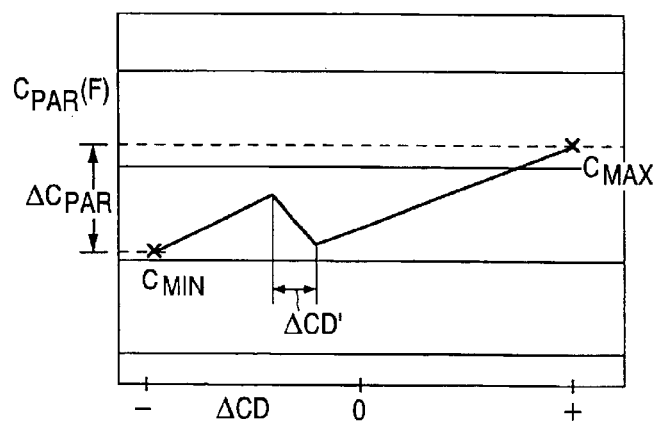
FIG. 3D plots variation in critical dimension versus parasitic capacitance for an interconnect structure in accordance with the present invention.

FIG. 3D plots variation in critical dimension versus parasitic capacitance for an interconnect structure in accordance with the present invention. FIG. 3D shows that the effect of penetration of third metal line 306a into inter-line region 308 is to reduce the effective distance between the plates of the parasitic capacitor formed by first metal line 302a, second metal line 302b, and intervening second ILD 306. This penetration by the third metal line elevates parasitic capacitance, but more importantly it reduces the variation of parasitic capacitance over a range of critical dimensions.

FIG. 3D shows that within the range ΔCD', the adjacent metal lines are sufficiently narrow to permit penetration of third metal line 310a. This downward projection of third metal line 310a into inter-line region 308 in turn causes an abrupt increase in parasitic capacitance. The effect of this jump is to substantially reduce variation in interconnect parasitic capacitance ($\Delta C_{PAR}$) over the range of critical dimensions.

Figure 4A:
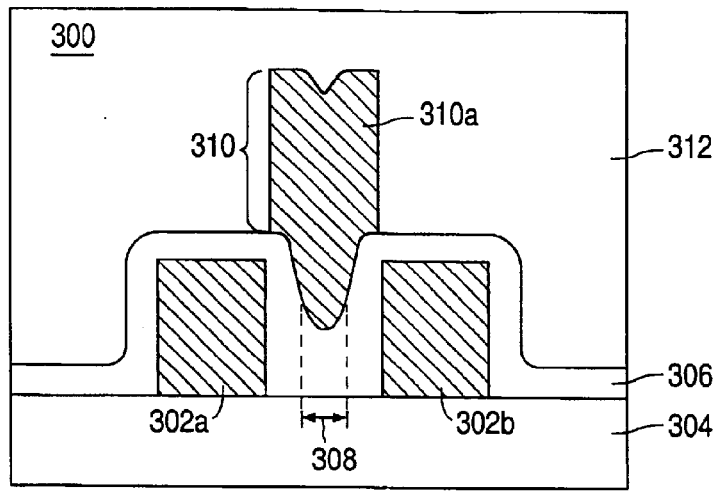
FIGS. 4A–4C show cross-sectional views of adjacent metal lines in an interconnect structure in accordance with embodiments of the present invention featuring second ILD layers of three different thicknesses.
Figure 4B:
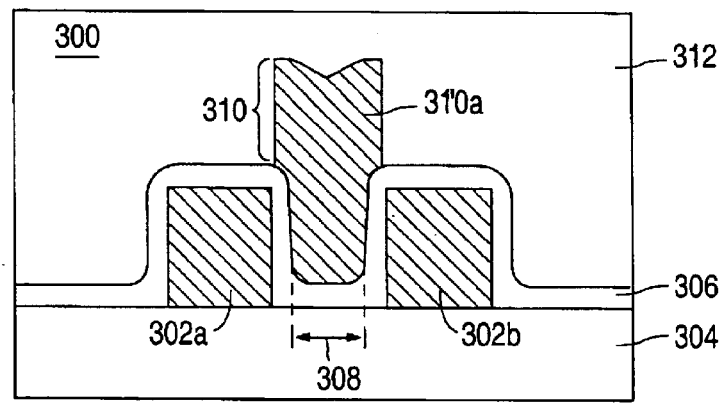
Figure 4C:
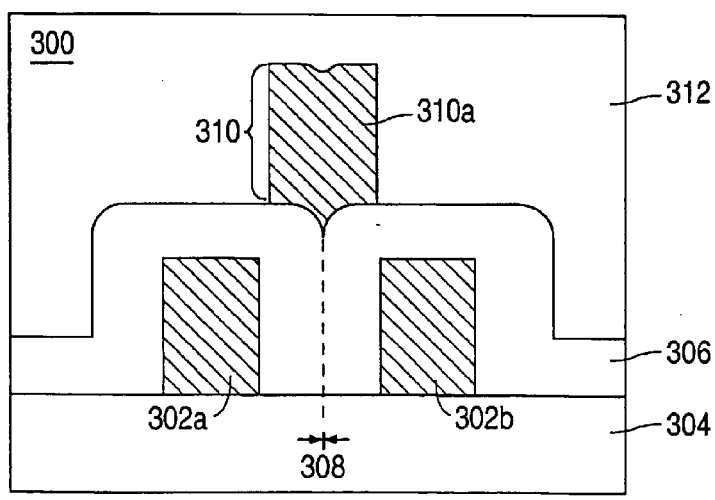

FIGS. 4A–4C illustrate that in addition to the width of the metal lines, another factor determining the extent of projection of the overlying third metal line between the adjacent metal lines is the thickness of the second interlayer dielectric. FIG. 4A shows an interconnect structure 300 featuring a second interlayer dielectric 306 of moderate thickness formed over adjacent metal lines 302a and 302b. FIG. 4B shows that where a thin second interlayer dielectric 306 is employed, inter-line spacing 308 between adjacent metal lines 302a and 302b increases. This permits third metal line 310a to penetrate into inter-line region 308 and thereby reduce variation in parasitic capacitance. Conversely, FIG. 4C shows that as the thickness of the second interlayer dielectric 306 increases, second interlayer dielectric 306 excludes third metal line 310a from inter-line region 308, preventing reduction in parasitic capacitance variation.

Thus, a method of reducing parasitic capacitance variation of an interconnect in accordance with the present invention requires that variation in critical dimension exhibited by a given photolithographic processes first be determined. Then, simulating the inter-line distance created by metal lines of varying critical dimensions, optimum thickness of a conformal interlayer dielectric separating the adjacent metal lines from the projecting third metal line is determined.

Performance of an interconnect structure in accordance with the present invention is optimized where the middle interlayer dielectric possesses a thickness such that the known range of critical dimension induces the overlying third metal line to project into the inter-line region and thereby reduce variation in parasitic capacitance.

Figure 5A:
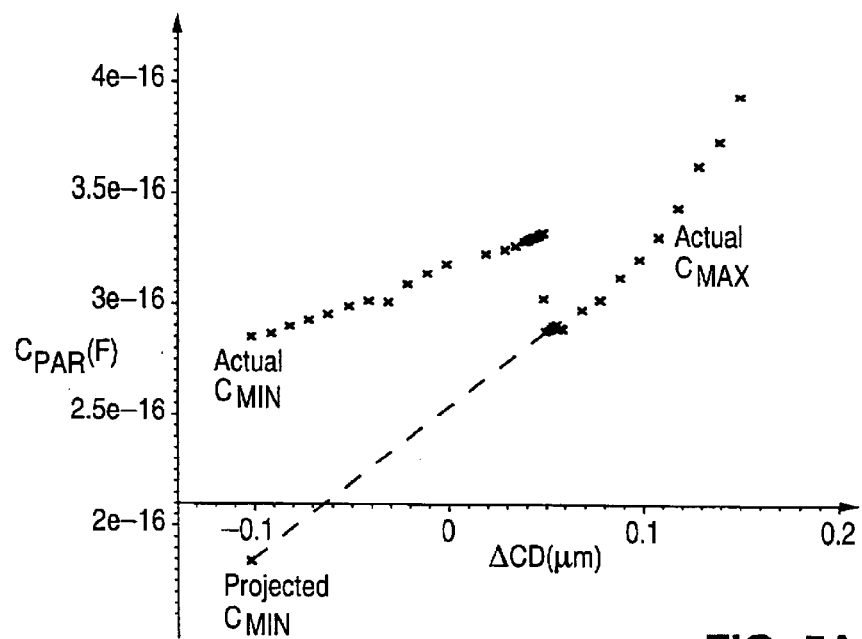
FIGS. 5A–5C plot simulated variation in critical dimension versus parasitic capacitance for embodiments of interconnect structures in accordance with the present invention featuring a second ILD layer of three different thicknesses.
Figure 5B:
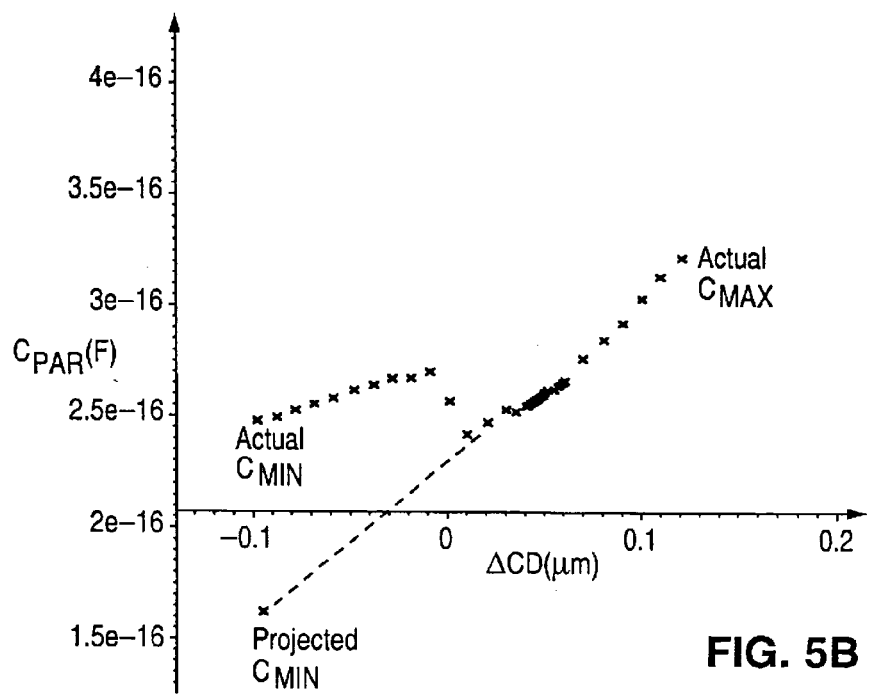
Figure 5C:
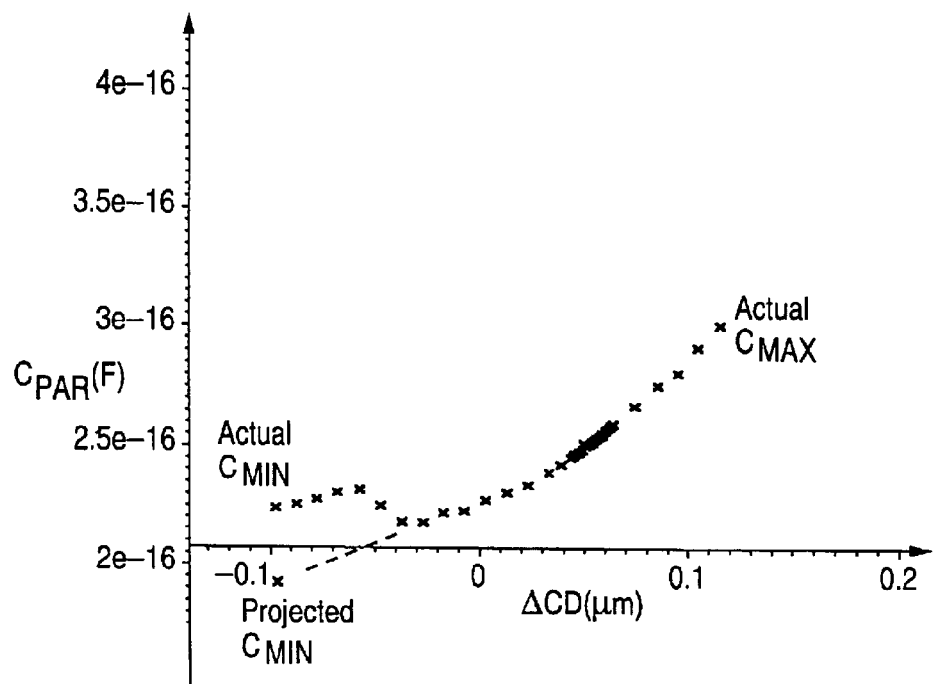

FIGS. 5A–5C plot simulated variation in critical dimension ($\Delta$CD) versus parasitic capacitance ($C_{PAR}$), for embodiments of an interconnect structure featuring adjacent metal lines having a critical dimension of 0.5 $\mu$m separated by an inter-line distance of 0.5 $\mu$m, where the second interlayer dielectric has thicknesses of 0.15 $\mu$m, 0.2 $\mu$m, and 0.25 $\mu$mx, respectively. In each of FIGS. 5A–5C, variation in critical dimension ($\Delta$CD) of the adjacent metal lines ranges between a negative value ($\Delta$CD leading to narrower metal lines) and a positive value ($\Delta$CD leading to broader metal lines).

FIG. 5A plots $\Delta$CD vs. $C_{PAR}$ for an embodiment of the present invention in which the second interlayer dielectric has a thickness of +0.15 $\mu$m. FIG. 5A shows that given this ILD thickness, the overlying third metal line begins to project between the first and second metal lines where $\Delta$CD approaches +0.1 $\mu$m. This is evidenced by the abrupt rise in parasitic capacitance at that $\Delta$CD.

FIG. 5B plots $\Delta$CD vs. $C_{PAR}$ for another embodiment of the present invention, wherein the thickness of the second interlayer dielectric is 0.2 $\mu$m. With this embodiment, projection of the third metal line between the first and second metal lines, and the corresponding reduction of parasitic capacitance variation, occurs at a $\Delta$CD about +0.05 $\mu$m.

FIG. 5C shows yet another embodiment, wherein thickness of the second interlayer dielectric is 0.25 $\mu$m. In this embodiment, projection of the third metal line between the first and second metal lines to boost parasitic capacitance and thereby reduce capacitance variation occurs at a $\Delta$CD approaching zero.

Reduction in parasitic capacitance variation demonstrated in FIGS. 5A–5C is summarized below in TABLE A.

this manner, photolithographic resolution ultimately determines the width of first and second metal lines 602a and 602b. The present invention suppresses variation in parasitic capacitance attributable to variation in critical dimension exhibited during this fabrication step.

Figure 6A:
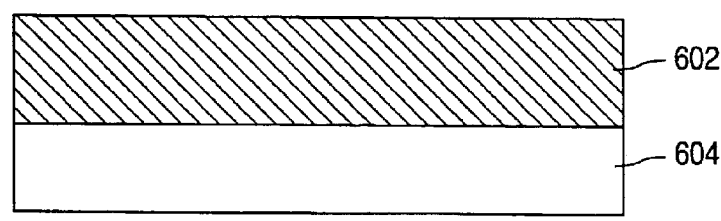
FIGS. 6A–6E show cross-sectional views of a process flow for forming an interconnect structure in accordance with one embodiment of the present invention.
Figure 6B:
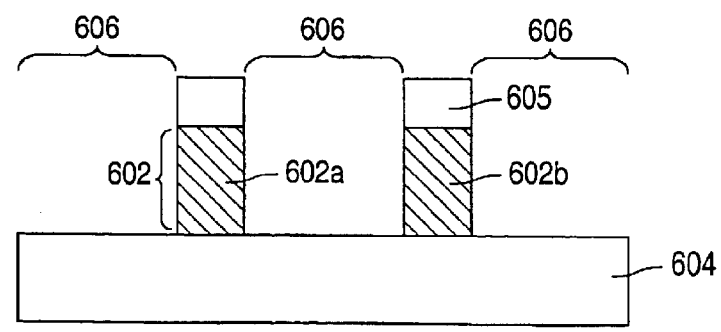
Figure 6C:
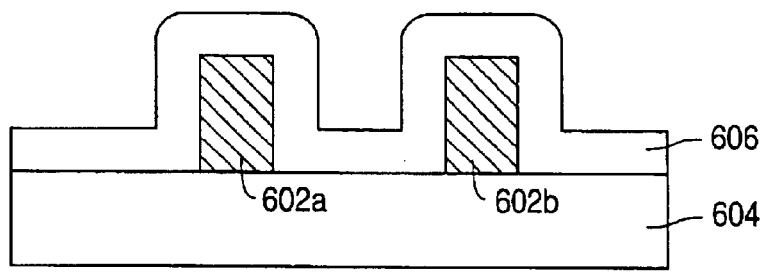

FIG. 6C shows the next step, wherein the patterned photoresist mask is stripped, and second interlayer dielectric 606 is formed. Second interlayer dielectric 606 conforms to the sidewalls and tops of first metal line 602a and second metal line 602b. Second interlayer dielectric 606 possesses a thickness substantially less ($\approx$20%) than the thickness of first interconnect metallization layer 602. The actual thickness of second interlayer dielectric 606 may be determined by modeling as described above in conjunction with FIGS. 5A–5C.

Figure 6D:
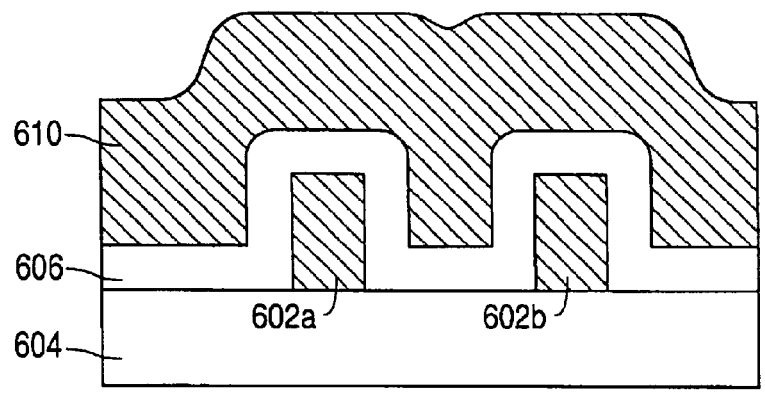

FIG. 6D shows formation of second interconnect metallization layer 610 over second interlayer dielectric 606. Second interconnect metallization layer 610 is the material from which the third metal line projecting between first metal line 602a and second metal line 602b will be formed.

Second interconnect metallization layer 610 can form the next successive metallization layer intended to carry the electrical signals of active devices. However, this is not the preferred form of the invention due to the relative thinness of underlying second interlayer dielectric 606. Thinness of underlying ILD layer 606 may fail to ensure the integrity of electric signals communicated along this interconnect metallization layer.

Figure 6E:
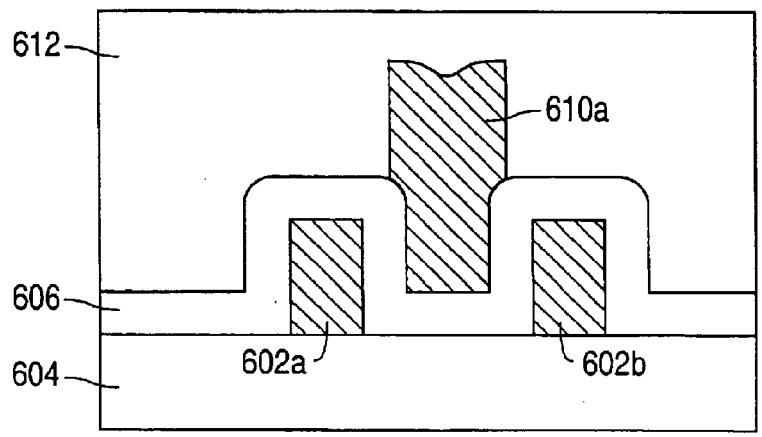

FIG. 6E shows completion of the process, wherein a second photoresist mask (not shown) is patterned over second interconnect metallization layer 610, and second interconnect metallization layer 610 is etched in unmasked regions to form third metal line 610a in electrical communication with either first metal line 602a or second metal line 602b. Third metal line 610a is positioned above and between first and second metal lines 602a and 602b. A portion of third metal line 610a projects far enough into inter-line region 608 between first metal line 602a and second metal line 602b to suppress variation in parasitic capacitance as described above.

TABLE A

REDUCTION IN CAPACITANCE VARIATION

| FIG. # | ILD THICKNESS ($\mu$m) | ACTUAL $C_{MAX}$ (F) (@ +1 $\mu$m) | PROJECTED $C_{MIN}$ (F) (@ −1 $\mu$m) | ACTUAL $C_{MIN}$ (F) (@ −1 $\mu$m) | PROJECTED $C_{VAR}$ (F) | ACTUAL $C_{VAR}$ (F) |
|---|---|---|---|---|---|---|
| 5A | 0.15 | $3.1 \times 10^{-16}$ | $1.8 \times 10^{-16}$ | $2.85 \times 10^{-19}$ | $1.3 \times 10^{-18}$ | $0.25 \times 10^{-16}$ |
| 5B | 0.20 | $3.15 \times 10^{-18}$ | $1.55 \times 10^{-18}$ | $2.45 \times 10^{-18}$ | $1.60 \times 10^{-16}$ | $0.70 \times 10^{-18}$ |
| 5C | 0.25 | $2.95 \times 10^{-14}$ | $2.0 \times 10^{-18}$ | $2.45 \times 10^{-16}$ | $0.95 \times 10^{-16}$ | $0.5 \times 10^{-16}$ |

As shown by FIGS. 5A–5C, modeling can enable determination of the optimum thickness of the second ILD layer necessary to achieve small interconnect parasitic capacitance over the $\Delta$CD of a given photolithography process.

FIGS. 6A–6E show cross-sectional views of a process for forming an interconnect structure in accordance with one embodiment of the present invention. FIG. 6A shows the starting point for the process, wherein first interconnect metallization layer 602 is formed over first interlayer dielectric 604. First interlayer dielectric 604 overlies a semiconductor workpiece (not shown) in which active semiconducting devices are fabricated.

FIG. 6B shows patterning of photoresist mask 605 over first interconnect metallization layer 602. Unmasked portions 606 of first interconnect metallization layer 604 are then etched to stop on first interlayer dielectric 604, forming first metal line 602a and adjacent second metal line 602b. In The interconnect structure and process flow in accordance with the present invention offers a number of important advantages over conventional structures and processes. One key advantage is substantial reduction in interconnect parasitic capacitance variation. Because variation in critical dimension of a particular photolithography process can be determined, and because thickness of the second interlayer dielectric can be carefully controlled, the extent of projection of the overlying third metal line between the adjacent metal lines can be precisely calculated. In this manner, the range of parasitic capacitance exhibited by the interconnect structure is narrowed, granting the IC designer greater certainty in anticipating the RC delay experienced by the active semiconductor devices.

Another advantage of the process in accordance with the present invention is its ready integration into existing process flows. Specifically, because the third metal line must merely be linked with one of the adjacent metal lines, the additional interconnect metallization layer is relatively simple to fabricate. No separate power supply or ground contacts for this layer are required, and the metallization layer need not contact other signal-carrying interconnect metallization layers.

Although the invention has been described in connection with one specific preferred embodiment, it must be understood that this invention is not limited to this particular embodiment. Various other modifications and alterations in the structure and process will be apparent to those skilled in the art without departing from the scope of the present invention.

For example, the interconnect layers described above can be composed of a variety of materials. Interconnect metallization can be composed of any electrically conducting material, with the most widely used materials being aluminum, copper, and tungsten metals. Similarly, interlayer dielectric can be composed of any conforming dielectric material, with the most popular materials being chemical vapor deposited silicon oxide, borophosphosilicate glass, and tetraethylorthosilicate.

Moreover, while the above figures illustrate implementing this invention in an interconnect structure formed by direct masking and etching of an interconnect metallization, the invention is not limited to this specific fabrication process.

Copper is increasingly employed as an interconnect metallization material. However, because of difficulty in selectively etching copper relative to interlayer dielectric, interconnect structures utilizing copper are formed by a damascene technique. In damascene processing, interconnect metallization is formed within an ILD trench, and then metal is removed outside of the ILD trench by chemical-mechanical polishing to form the adjacent interconnect metal lines.

The damascene technique described above suffers from the same variation in critical dimension described extensively above. Specifically, the ILD trench defining the width of the metal line is generally created by photolithographic processes.

Figure 7A:
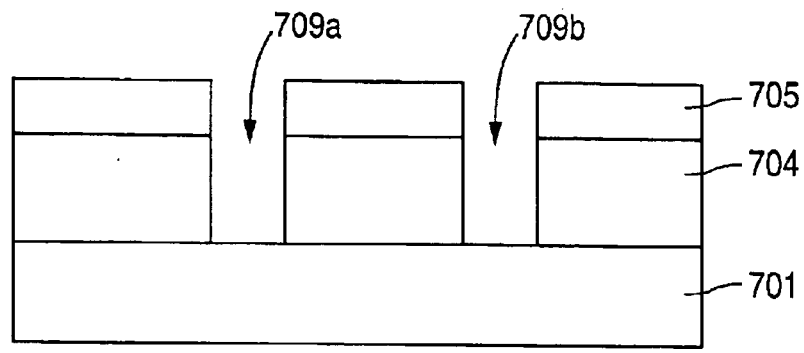
FIGS. 7A–7F show cross-sectional views of a process flow for forming an interconnect structure in accordance with an alternative embodiment of the present invention.

Therefore, FIGS. 7A–7F show an alternative embodiment of the present invention, wherein an interconnect structure featuring the third projecting metal line is formed using a damascene-type process. FIG. 7A shows the first step of the process, wherein first photoresist mask 705 is patterned over a middle interlayer dielectric 704 overlying a lower interlayer dielectric 701. Middle interlayer dielectric 704 is then etched to stop an lower interlayer dielectric 701 in unmasked regions 707, forming trenches 709a and 709b.

Figure 7B:
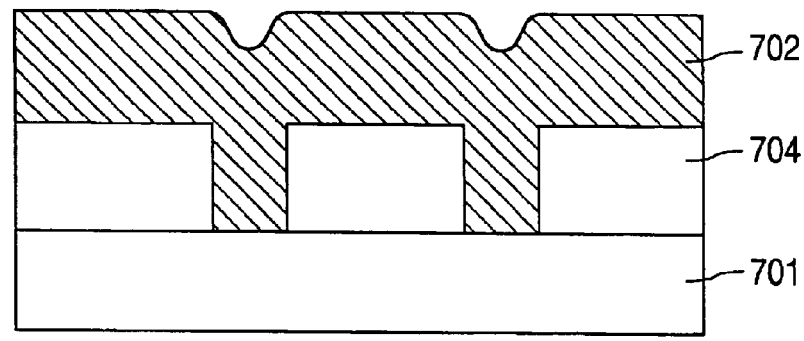

FIG. 7B shows the next step in the process, wherein the first photoresist mask is stripped and first interconnect metallization layer 702 is formed over the surface. First interconnect metallization layer 702 penetrates into trenches 709a and 709b during this step.

Figure 7C:
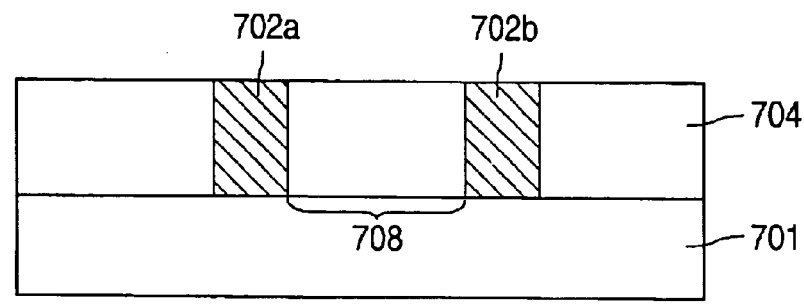

FIG. 7C shows the next step in the process, wherein first interconnect metallization 702 is removed outside of trenches 709a and 709b by chemical-mechanical polishing. This step leaves first metal line 702a adjacent to second metal line 702b separated by middle interlayer dielectric 704 in inter-line region 708.

Figure 7D:
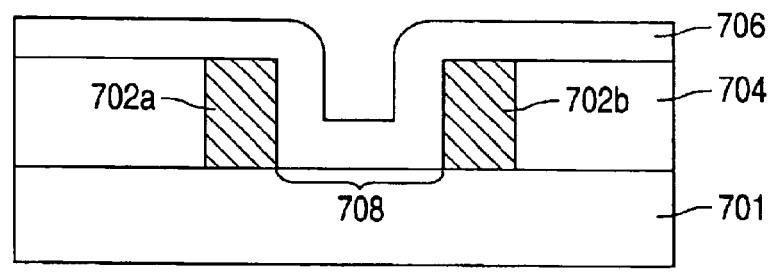

FIG. 7D shows the next step, wherein middle interlayer dielectric 704 is removed in inter-line region 708, followed by formation of thin, conformal interlayer dielectric 706 over the entire surface. Thin interlayer dielectric 706 conforms to the exposed sidewalls of adjacent metal lines 702a and 702b, and penetrates into inter-line region 708.

Figure 7E:
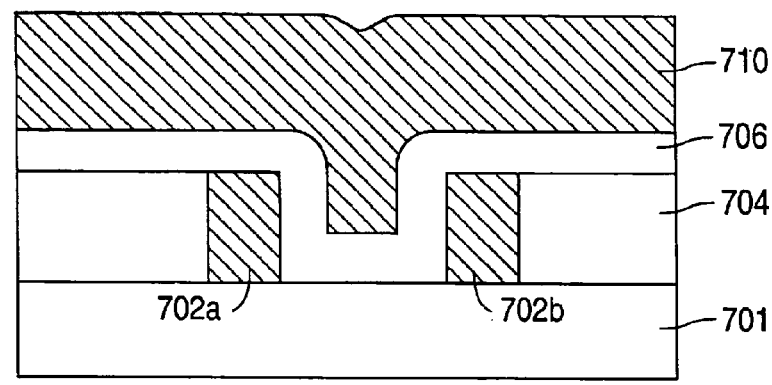

FIG. 7E shows the next step in the alternative process flow, wherein second interconnect metallization layer 710 is formed over thin, conformal ILD layer 706. Depending upon such factors as the thickness of thin ILD layer 706 relative to the width of inter-line region 708 and of metal lines 702a and 702b, second interconnect metallization layer 710 penetrates to a varying degree into inter-line region 708.

Figure 7F:
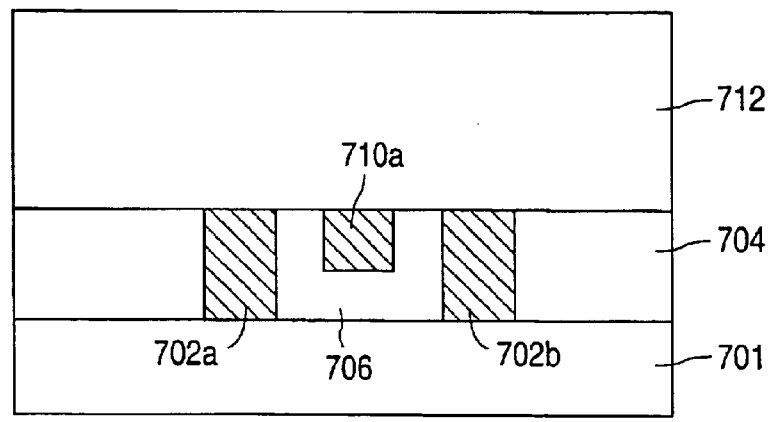

FIG. 7F shows completion of the interconnect structure, wherein second interconnect metallization layer 710 and conformal interlayer dielectric 706 are removed outside of inter-line region 708 by chemical-mechanical polishing. This step leaves third metal line 710a projecting between adjacent metal lines 702a and 702b. A passivation or succeeding ILD layer 712 is then formed over the interconnect structure.

Given the above description and the variety of embodiments disclosed therein, it is intended that the following claims define the scope of the present invention, and that processes within the scope of these claims and their equivalents be covered hereby.

What is claimed is:

1. In a process for forming an interconnect including the steps of patterning a photoresist mask featuring masked areas corresponding to a critical dimension, and then etching an underlying interconnect metallization layer in unmasked areas to leave adjacent first and second metal lines having a width corresponding to the critical dimension, a method for reducing variation in parasitic capacitance between the metal lines attributable to a variation in critical dimension, the method comprising the steps of:

determining a range of critical dimensions exhibited by a photolithography process; and simulating variation in parasitic capacitance over the critical dimension range by determining the extent of penetration of an overlying third metal line into an inter-line region between the metal lines, a width of the inter-line region determined by a thickness of the conformal middle interlayer dielectric and by the critical dimension, such that penetration of the third metal line elevates parasitic capacitance while reducing parasitic capacitance variation over the critical dimension range.

2. In a process for forming an interconnect including the steps of patterning a photoresist mask featuring masked areas corresponding to a critical dimension, etching an underlying interlayer dielectric in unmasked areas to leave adjacent first and second trenches having a width corresponding to the critical dimension, and then filling the first and second trenches with interconnect metallization to form first and second metal lines, a method for reducing variation in parasitic capacitance between the metal lines attributable to a variation in critical dimension, the method comprising the steps of:

determining a range of critical dimensions exhibited by a photolithography process; and simulating variation in parasitic capacitance over the critical dimension range by determining the extent of penetration of an overlying third metal line into an inter-line region between the metal lines, a width of the inter-line region determined by a thickness of the conformal middle interlayer dielectric and by the critical dimension, such that penetration of the third metal line elevates parasitic capacitance while reducing parasitic capacitance variation over the critical dimension range.

* * * * *